United States Patent
Malstrom et al.

(10) Patent No.: US 9,953,845 B2
(45) Date of Patent: Apr. 24, 2018

(54) METHODS AND SYSTEMS FOR FORMING ELECTRONIC MODULES

(75) Inventors: Charles Randall Malstrom, Lebanon, PA (US); David Sarraf, Elizabethtown, PA (US); Miguel Angel Morales, Fremont, CA (US); Leonard Henry Radzilowski, Palo Alto, CA (US); Michael Fredrick Laub, Enola, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 957 days.

(21) Appl. No.: 13/242,240

(22) Filed: Sep. 23, 2011

(65) Prior Publication Data

US 2013/0074328 A1 Mar. 28, 2013

(51) Int. Cl.
*H01L 21/48* (2006.01)
*H01L 23/498* (2006.01)

(52) U.S. Cl.
CPC ...... *H01L 21/4846* (2013.01); *H01L 23/4985* (2013.01); *H01L 2924/0002* (2013.01); *Y10T 29/49117* (2015.01); *Y10T 29/49156* (2015.01)

(58) Field of Classification Search
CPC ........ H05K 3/007; H05K 3/022; H05K 3/025; H05K 3/06; H05K 1/141; H05K 13/0023; H05K 13/0417; G08B 13/2431; G08B 13/2434; G08B 13/244; Y10T 29/49117; Y10T 29/49156; H01L 21/4846; H01L 23/4985; H01L 2924/0002
USPC ......... 29/847, 738, 739, 832, 846, 729, 825, 29/25.01; 156/540, 549, 89.12; 174/250, 174/260; 216/14; 257/668; 361/728, 361/736, 730, 748; 427/96.1; 439/56
See application file for complete search history.

(56) References Cited

U.S. PATENT DOCUMENTS 5,840,402 A * 11/1998 Roberts ................ H05K 1/0287
  174/250
6,472,726 B1 * 10/2002 Hashimoto ......... H01L 23/4985
  257/668
6,858,253 B2    2/2005 Williams et al.
(Continued)

FOREIGN PATENT DOCUMENTS

CN    1407611 A    4/2003
CN    1444270 A    9/2003
(Continued)

OTHER PUBLICATIONS

Search Report for Chinese Application No. 2012104209443 dated Feb. 19, 2016.

*Primary Examiner* — A. Dexter Tugbang
*Assistant Examiner* — Jeffrey T Carley

(57) ABSTRACT

A method of manufacturing an electronic module includes providing a conductive strip and a dielectric material. The method includes coating the dielectric material and the conductive strip to form a layered structure having a conductive layer defined by the conductive strip and a dielectric layer defined by the dielectric material. The method includes applying a carrier strip to the layered structure. The method includes processing the conductive layer to form a circuit while the layered structure is on the carrier strip. The method includes removing the carrier strip from the layered structure. The method includes applying the layered structure with the circuit to an electronic module substrate.

11 Claims, 3 Drawing Sheets

(56) References Cited

U.S. PATENT DOCUMENTS

| | | |
|---|---|---|
| 7,173,322 B2 | 2/2007 | Sakata et al. |
| 7,848,671 B2 | 12/2010 | Mochizuki |
| 2003/0038379 A1 | 2/2003 | Kawasaki et al. |
| 2003/0207211 A1* | 11/2003 | Huang ................ H05K 3/0097 430/311 |
| 2006/0283539 A1* | 12/2006 | Slafer ..................... B05D 1/28 156/230 |
| 2007/0023876 A1 | 2/2007 | Nakamura et al. |
| 2008/0076209 A1 | 3/2008 | Klink et al. |
| 2008/0136571 A1* | 6/2008 | Peter et al. ................... 335/306 |
| 2011/0207328 A1* | 8/2011 | Speakman .......... H01L 51/0016 438/694 |

FOREIGN PATENT DOCUMENTS

| | | |
|---|---|---|
| CN | 1512920 A | 7/2004 |
| CN | 1905183 A | 1/2007 |
| CN | 101201571 A | 6/2008 |
| TW | 1230029 B | 3/2005 |
| TW | I230029 B | 3/2005 |

\* cited by examiner

METHODS AND SYSTEMS FOR FORMING ELECTRONIC MODULES

BACKGROUND OF THE INVENTION

The subject matter herein relates generally to methods and systems for forming electronic modules. Electronic modules are used for many applications, including high power applications, such as solid state lighting.

Currently, within the solid state lighting market, light emitting diodes (LEDs) are mounted on metal clad circuit boards to form electronic modules. The metal clad circuit boards are useful in high power LED solutions for adequate heat spreading or heat sinking of the LEDs. Other electronic components may be mounted to the metal clad circuit boards to define other types of electronic modules.

Metal clad circuit boards typically include a base or substrate, such as an aluminum sheet, that has an electrically insulative, but somewhat thermally conductive layer to isolate the base aluminum from copper traces which are on top of the insulative layer. The metal clad circuit boards are manufactured in a batch process, much like a traditional printed circuit board made from a glass epoxy material, such as an FR4 circuit board, where many electronic modules are formed from one large sheet or product. Many electronic modules are arranged in rows and columns on the sheet.

Circuit boards manufactured by the batch process are not without disadvantages. For instance, every time a new geometry or circuit is required, an etch resist plate needs to be created. This requires time and money investment before the circuit geometry can be made. Additionally, a high amount of scrap or waste material is generated between electronic modules.

A need remains for a circuit board that can be manufactured in a cost effective and reliable manner. A need remains for a circuit board that has effective heat dissipation.

BRIEF DESCRIPTION OF THE INVENTION

In one embodiment, a method of manufacturing an electronic module includes providing a conductive strip and a dielectric material. The method includes laminating the dielectric material and the conductive strip to form a layered structure having a conductive layer defined by the conductive strip and a dielectric layer defined by the dielectric material. The method includes applying a carrier strip to the layered structure. The method includes processing the conductive layer to form a circuit while the layered structure is on the carrier strip. The method includes removing the carrier strip from the layered structure. The method includes applying the layered structure with the circuit to an electronic module substrate.

In another embodiment, an electronic module formation system includes a layered structure that has a conductive layer and a dielectric layer. The layered structure has a first portion and a second portion. The first portion is supported by an unwound segment of a reel to reel carrier strip. The conductive layer of the first portion is processed to form a plurality of circuits. The second portion is supported by an electronic module substrate. The layered structure and electronic module around the circuits are singulated to from individual electronic modules.

In a further embodiment, an electronic module formation system includes a first reel upon which a carrier strip is wound. A second reel upon which the carrier strip pulled off from the first reel is wound up. A laminate application station applies a layered structure to the unwound carrier strip. The layered structure is processed while on the carrier strip to form at least one circuit. The layered structure is removed from the carrier strip after the at least one circuit is formed and prior to the carrier strip being wound on the second reel. A substrate application station applies the layered structure, removed from the carrier strip, to an electronic module substrate. The layered structure and electronic module substrate is progressively pulled through the substrate application mechanism.

DETAILED DESCRIPTION OF THE INVENTION

Figure 1:
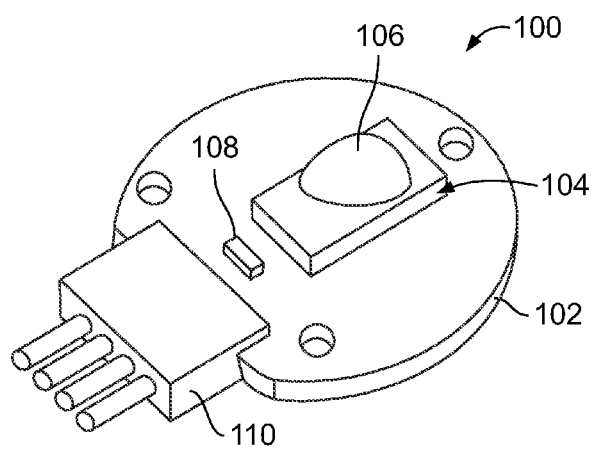
FIG. 1 illustrates an electronic module formed in accordance with an exemplary embodiment.

FIG. 1 illustrates an electronic module 100 formed in accordance with an exemplary embodiment. The electronic module 100 includes a circuit board 102 having one or more electronic components 104 mounted thereto. In the illustrated embodiment, the electronic module 100 is configured for a high power application, such as a high power LED application. In an exemplary embodiment, the circuit board 102 is a metal clad circuit board having a metal base or substrate useful for heat spreading or heat sinking of the electronic components 104. In alternative embodiments, the circuit board 102 may have a base or substrate that is manufactured from a material other than metal.

In an exemplary embodiment, the circuit board 102 includes a metal substrate that provides heat transfer to cool the electronic components 104 mounted to the circuit board 102. The metal substrate of the circuit board 102 provides better thermal transfer than other types of circuit boards, such as circuit boards manufactured from glass epoxy or FR4 materials. The metal substrate of the circuit board 102 provides a mechanically robust substrate that is not as fragile as other types of circuit boards. The circuit board 102 provides low operating temperatures for the electronic components 104 and has increased thermal efficiency for dissipating heat from the electronic components 104. The circuit board 102 has high durability and may have a reduced size by eliminating the need for an additional heat sink. In alternative embodiments, the circuit board 102 may include a non-metal substrate, such as a semi-metal or a non-metal substrate (e.g. a copper graphite substrate). Such substrates may be manufactured from a material that is lighter weight than a metal substrate. Such substrates may still be highly thermally conductive and thus suitable for heat dissipation applications. In some alternative embodiments, the circuit board 102 may include a plastic or other similar, non-metal substrate. The plastic substrate may be a thermally conductive plastic suitable for heat dissipation applications.

In the illustrated embodiment, the electronic components 104 include an LED 106 and a temperature sensor 108. Other types of electronic components 104 may be used in alternative embodiments. An electrical connector 110 is coupled to the electronic module 100. The electrical connector 110 provides power and/or data to the electronic module 100.

The electronic module 100 may be used in other applications other than in an LED application. For example, the electronic module 100 may be used as part of a power device, RF transistors, military electronics, or other applications, including non-power applications. The electronic module 100 may form part of an electrical connector, such as a wafer, chicklet or contact module having a leadframe or conductors embedded in or on an insulative body.

Figure 2:
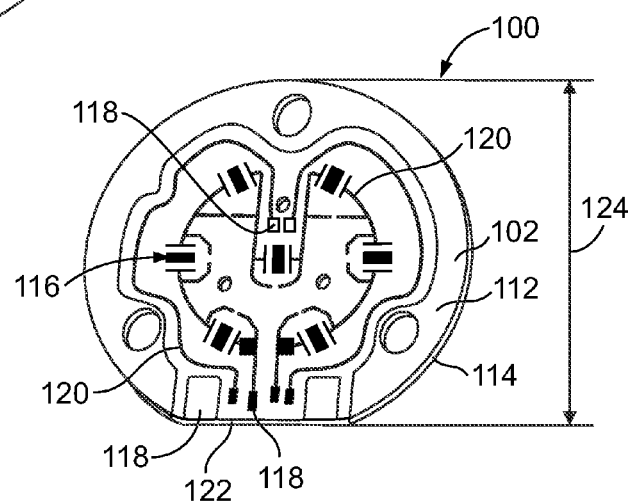
FIG. 2 illustrates a portion of the electronic module shown in FIG. 1.

FIG. 2 illustrates a portion of the electronic module 100 formed in accordance with an exemplary embodiment. The electronic module 100 includes a first side 112 and a second side 114 opposite the first side 112. One or more circuits 116 are arranged on the first side 112. The electronic components 104 (shown in FIG. 1) are configured to be coupled to corresponding circuits 116. The circuits 116 include pads 118 for terminating the electronic components 104 and/or the electrical connector 110 (shown in FIG. 1) to the corresponding circuits 116. The circuits 116 are defined by traces 120. The circuits 116 may include electrical elements, such as resistors, inductors, capacitors, and the like. The circuit 116 may have any configuration depending on the particular application, the number, type and positioning of the electric components 104, and the number, type and positioning of the electrical connector 110.

In the illustrated embodiment, the circuit board 102 is generally circular in shape and includes a flat edge 122, where the electrical connector 110 is coupled to the circuit board 102. The circuit board 102 has a width 124 measured between the edge 122 and a point along the exterior of the circuit board 102 opposite the edge 122. The width 124 may be slightly less than the diameter. The circuit board 102 may have other shapes in alternative embodiments.

Figure 3:
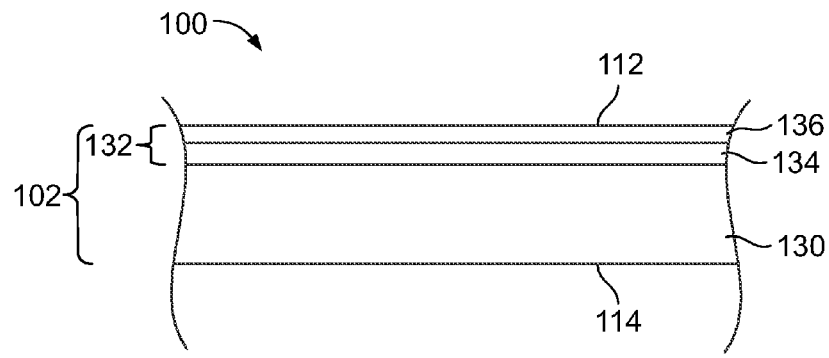
FIG. 3 is a cross-sectional view of a portion of the electronic module shown in FIG. 1.

FIG. 3 is a cross-sectional view of the circuit board 102. The circuit board 102 includes an electronic module substrate 130 and a layered structure 132 deposited on the electronic module substrate 130. The electronic module substrate 130 is a support structure for the layered structure 132. In an exemplary embodiment, the layered structure 132 is deposited directly on the electronic module substrate 130.

In an exemplary embodiment, the electronic module substrate 130 functions to dissipate heat, such as from the electronic components 104 of the circuit board 102. The electronic module substrate 130 constitutes a heat spreader or heat sink. The electronic module substrate 130 is fabricated from a material having a high thermal conductivity, such as an aluminum material, a copper material, a thermally conductive plastic and the like. The substrate 130 efficiently transfers heat from the electronic components 104 (shown in FIG. 1) mounted to the circuit board 102, such as the LED 106 (shown in FIG. 1). Optionally, a thickness of the substrate 130 may be at least half the overall thickness of the circuit board 102 measured between the first and second sides 112, 114 of the circuit board 102. Having a thick metal substrate provides rigidity and robustness to the circuit board 102. In embodiments that are less concerned with heat dissipation, the substrate 130 may be manufactured from a material having desired characteristics, such as high strength, light weight, inexpensive, or other characteristics.

The layered structure 132 includes a dielectric layer 134 and a conductive layer 136. The conductive layer 136 defines the circuits 116 (shown in FIG. 2). The dielectric layer 134 may be comprised of one or more layers of dielectric material. The conductive layer 136 may be comprised of one or more layers of conductive material. The dielectric layer 134 is positioned between the conductive layer 136 and the electronic module substrate 130. The dielectric layer 134 is electrically insulative. The dielectric layer 134 is thermally conductive to transfer heat from the conductive layer 136 to the electronic module substrate 130.

The dielectric layer 134 electrically isolates the metal substrate 130 from the conductive layer 136. The dielectric layer 134 has a low thermal resistance so effective thermal transfer can occur to the substrate 130. The thickness of the dielectric layer 134 as well as the type of material used for the dielectric layer 134 may affect thermal conductivity or thermal resistivity properties of the dielectric layer 134. The dielectric layer 134 is relatively thin to allow adequate thermal transfer through the dielectric layer 134 to the substrate 130. In an exemplary embodiment, the dielectric layer 134 is between approximately 0.002" and 0.003". Other thicknesses of the dielectric layer 134 are possible in alternative embodiments.

The dielectric layer 134 has adequate dielectric properties to maintain electrical isolation between the substrate 130 and the conductive layer 136. For example, the dielectric layer 134 may need to be rated to withstand a predetermined voltage level. The thickness of the dielectric layer 134 as well as the type of material used for the dielectric layer 134 may affect the dielectric properties and effectiveness of the dielectric layer 134. Different types of dielectric materials may be used in various embodiments.

In an exemplary embodiment, the dielectric layer 134 includes a material that is an electrical insulator, such as polymer base material or resin. Optionally, the dielectric layer 134 may include fillers, additives or other particles mixed in with the polymers to change properties of the dielectric layer 134, such as the thermal efficiency of the dielectric layer 134. For example, particles such alumina or boron nitride particles may be added to the polymer base material to make the dielectric layer 134 more thermally conductive. Other types of fillers may be added to the mixture to change other characteristics of the dielectric layer 134.

The dielectric layer 134 may be applied as a powder, film, epoxy, or come in other forms. The dielectric layer 134 may be applied to the conductive layer 136 using different processes. In an exemplary embodiment, the dielectric layer 134 is an epoxy applied to the conductive layer 136. For example, the dielectric layer 134 may include a liquid suspension having a mixture of polymers, fillers and solvent that is spread either directly onto the conductive layer 136 or alternatively onto a polyester film, which is then transferred to the conductive layer 136. The mixture is then at least partially cured to secure the dielectric layer 134 to the conductive layer 136. The epoxy may be applied to the conductive layer 136 using a doctor blade coater, a draw down coater, a slot die coater or another application machine. Alternatively, the dielectric layer 134 is powder coated to the conductive layer 136, such as using a spray coater or a fluidized bed. The dielectric layer 134 includes fine powder particles composed of a mixture of polymers and fillers that may be compression molded onto to the conductive layer 136.

Figure 4:
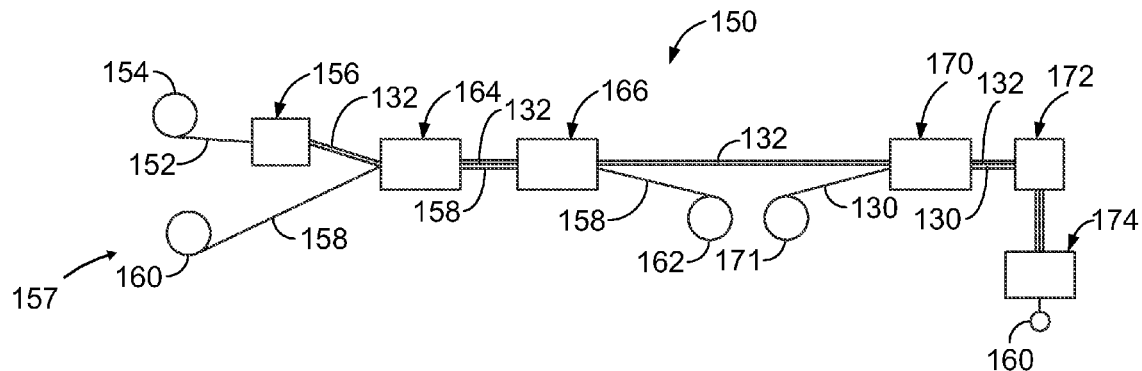
FIG. 4 illustrates an electronic module formation system formed in accordance with an exemplary embodiment.

FIG. 4 illustrates an electronic module formation system 150 used to form electronic modules, such as the electronic module 100. The system 150 includes a plurality of stations that perform operations or functions on materials to form the electronic modules 100. The system 150 is an in-line system that progressively feeds product, such as strips or reels of material, through the stations to process the materials to form the electronic modules 100. For example, the product may be continuously feed to stations for processing. In an exemplary embodiment, the system 150 is a reel system that winds and/or unwinds material from reels to progressively process the electronic modules 100 through the system 150.

The system 150 includes a conductive strip 152, which is wound up on a conductive strip reel 154 and continuously unwound and pulled through the system 150. The conductive strip 152 may be a copper foil. The width of the copper foil may be dependent on the width 124 (shown in FIG. 2) designed for the circuit board 102. Optionally, the width of the conductive strip 152 may be slightly wider than the width 124 such that one circuit board 102 may be singulated from the strip pulled through the system 150.

The system 150 includes a coating station 156. The coating station 156 applies dielectric material to the conductive strip 152. The strip exiting the coating station 156 defines the layered structure 132 (shown in FIG. 3). The dielectric material may be applied in a known manner, such as by coating the conductive strip 152, using a doctor blade coater, a draw down coater, a slot die coater or another type of coater. The dielectric material may be applied by processes other than coating. The dielectric material may be coated by laminating the dielectric layer to the conductive strip 152. The dielectric material may be applied as an epoxy. Alternatively, the dielectric material may be applied in other forms, such as a powder. The dielectric material may be subjected to heat and/or pressure at the coating station 156 to secure the dielectric material to the conductive strip 152. The dielectric material may be at least partially cured in the coating station 156 or at a subsequent station downstream of the coating station 156. Optionally, the dielectric material may be cured to an intermediate or partial curing stage, such as a B-stage, to allow the dielectric material to be secured to a carrier strip 158.

A transfer device 157 is used to advance the carrier strip 158 through the system 150. Optionally, the transfer device 157 may be one or more reels upon which the carrier strip 158 is wound and/or unwound. The transfer device 157 may be a conveyor, such as a conveyor belt or roll. The carrier strip 158 may be reusable by winding up the carrier strip 158 on a reel or continuously conveying the carrier strip 158 through the system 150. Alternatively, the carrier strip 158 may not be reusable, but rather is a strip that is progressed through the system 150 and discarded. In other alternative embodiments, the carrier strip 158 forms part of the final product and is therefore not reusable. In the illustrated embodiment, the transfer device 157 is a reel system upon which the carrier strip 158 is unwound and wound, however the subject matter herein is not intended to be limited to such system as other types of devices may be used to transfer the carrier strip 158 through the system 150. The carrier strip 158 is wound up on a first carrier strip reel 160 and unwound from the reel 160 as the carrier strip 158 is pulled through the system 150. The carrier strip 158 is later wound onto a second carrier strip reel 162. The second carrier strip 162 pulls the carrier strip 158 through the system 150. The carrier strip 158 is attached to the layered structure 132 at a carrier strip application station 164. The carrier strip 158 is applied to the dielectric layer 134 (shown in FIG. 3) of the layered structure 132 at the carrier strip application station 164. The carrier strip 158 may be applied to the layered structure 132 (and/or the layered structure 132 may be applied to the carrier strip 158) by pressing the carrier strip 158 against the dielectric layer 134.

The carrier strip 158 may be a film, such as polyester film. The carrier strip 158 is used to advance the layered structure 132 at least partially through the system 150. The carrier strip 158 is later removed from the layered structure 132 to allow the layered structure 132 to be attached to the electronic module substrate 130 (shown in FIG. 3). The carrier strip application station 164 non-permanently secures the dielectric layer 134 of the layered structure 132 to the carrier strip 158 such that the dielectric layer 134 is removable from the carrier strip 158 without destroying the layered structure 132.

In an alternative embodiment, rather than the carrier strip 158 being a separate component, such as a film, that pulls the layered structure 132 through the system 150, the carrier strip 158 may form part of the layered structure 132 that is presented downstream through the system 150. In such embodiments, the carrier strip 158 is not removed from the layered structure 132. For example, the carrier strip 158 may be a strengthening or reinforcing mesh that is embedded in the dielectric layer 134 or that forms part of the dielectric layer 134. Such mesh remains as part of the layered structure 132 in the final product. In other alternative embodiments, the conductive strip 152 defines the carrier strip and a separate film or strip does not need to be provided as the conductive strip 152 is the portion of the layered structure 132 that is progressively pulled through the system 150.

The carrier strip 158 progresses or transfers the layered structure 132 through at least one processing station 166. The processing station 166 forms the circuit 116 (shown in FIG. 2) from the conductive layer 136. Because the strip is progressively moved through the system 150, a series of circuits 116 are formed from the conductive layer 136 as the conductive strip 152 is progressed through the system 150.

The processing station 166 is used to transform the conductive layer 136 into the circuits 116. Multiple processes may be performed in the processing station 166 and/or multiple processing stations 166 may be provided in the system 150.

In an exemplary embodiment, an etch resist layer is applied to the conductive layer 136. The etch resist layer may be printed onto the conductive layer 136. For example, the etch resist layer may be an ink that is pad printed, ink jet printed or silk screen printed onto the conductive layer 136. The ink may be UV cured onto the conductive layer 136.

The portion of the conductive layer 136, that is not covered with the etch resist layer, is then etched away. For example, the product may pass through an aqueous etch bath to remove the copper of the conductive layer 136 that is not covered with the etch resist layer.

After the etching process, the etch resist layer is removed, such as by stripping the etch resist layer in a bath or by another process. Once the etch resist layer is removed, the conductive layer 136 is exposed, with portions of the conductive layer 136 removed to define the circuits 116.

Optionally, the remaining portions of the conductive layer 136 may be plated, such as with a tin plating. Other processes may be performed at the processing station 166 to form the circuits 116.

The strip is progressively passed through the processing station 166 to form a series of the circuits 116 on the strip. In an exemplary embodiment, the carrier strip 158 remains largely unaffected by the processes performed in the processing station 166. The carrier strip 158 does not need to be protected, for example covered with an etch resist layer, as the carrier strip 158 is manufactured from a polyester material or another material unaffected by the etching process. Additionally, the carrier strip 158 does not form part of the final product as it is removed at a later stage, so damage to the carrier strip 158 is irrelevant for the final product. Not having to protect the carrier strip 158 allows the electronic module formation to occur more quickly and inexpensively, such as compared to a system where the substrate 130 passes through the processing station 166.

After the product passes through the processing station 166, the product moves to a carrier strip removal station where the carrier strip 158 is removed from the layered structure 132. In an exemplary embodiment, the carrier strip 158 is wound onto the second carrier strip reel 162. The carrier strip 158 is peeled away from the layered structure 132 (and/or the layered structure 132 is peeled away from the conductive strip 152) as the carrier strip 158 is wound on the second carrier strip reel 162. The layered structure 132 continues on beyond the second carrier strip reel 162. The carrier strip 158 is removed from the dielectric layer 134 without damaging the dielectric layer 134. The dielectric layer 134 remains attach to the conductive layer 136. As noted above, the carrier strip 158 need not be wound on a reel, but rather other types of transfer devices may be used, such as a conveyor belt or rollers. Additionally, in some embodiments, the carrier strip 158 is not removed but rather forms part of the layered structure 132 that is passed through the system. In such embodiments, the system 150 does not include a carrier strip removal station.

The layered structure 132 is progressively pulled through a substrate application station 170. The electronic module substrate 130 is provided on a substrate reel 171. The substrate 130 is unwound from the reel and progressively presented to the substrate application station 170 for attaching the substrate 130 to the layered structure 132. The electronic module substrate 130 may be advanced by a device other than a reel in alternative embodiments. Once the layered structure 132 is attached to the substrate 130, the layered structure 132 may be advanced through the system 150 on the substrate 130.

At the substrate application station 170, the layered structure 132 is applied to the electronic module substrate 130. The layered structure 132 may be applied to the substrate 130 by pressing the dielectric layer 134 against the substrate 130. In an exemplary embodiment, a pair of rollers are provided and the layered structure 132 and substrate 130 are progressively passed through the rollers to press the dielectric layer 134 into the substrate 130. The layered structure 132 and substrate 130 may undergo a lamination process, such as a roll laminating process, to attach the dielectric layer 134 to the substrate 130. Other processes may be performed to secure the layered structure 132 to the substrate 130.

The product is passed to a curing station 172 where the dielectric layer 134 undergoes a secondary curing. The secondary curing may fully cure the dielectric layer 134. The secondary curing process of the dielectric layer 134 tends to permanently secure the dielectric layer 134 to the conductive layer 136 and/or the substrate 130. The secondary curing may be performed at the substrate application station 170, such as by using a hot roll laminating process to both apply and cure the layered structure 132 to the substrate 130.

The product is progressively transferred to a singulation station 174 where the electronic modules 100 are singulated from the strip. The singulation station 174 may singulate the electronic modules 100 by cutting or punching the electronic modules 100 from the strip of the layered structure 132 and substrate 130. The electronic modules 100 may be tightly packaged on the strip in a line along the strip, such that there is little scrap or product waste. The progressive formation process allows a higher volume of electronic modules 100 to be produced as compared to batch processes.

Figure 5:
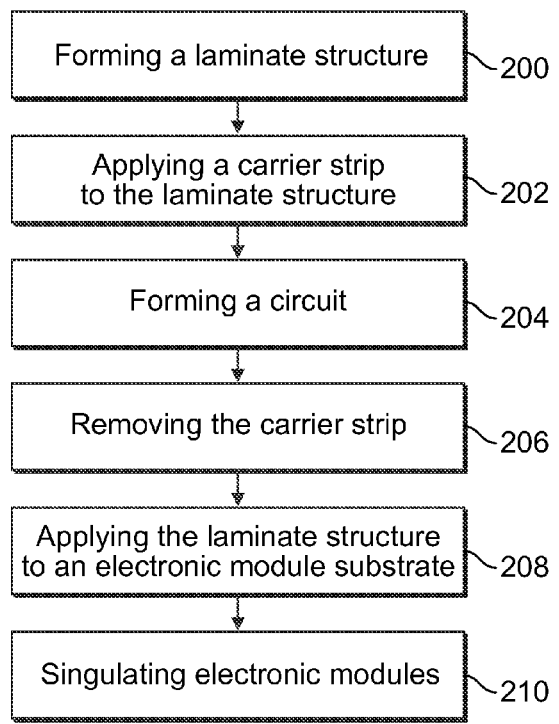
FIG. 5 illustrates a method of manufacturing electronic modules.

FIG. 5 illustrates a method of manufacturing electronic modules, such as the electronic module 100 (shown in FIG. 1) in accordance with an exemplary embodiment. The method includes forming 200 a layered structure. The layered structure may be formed by coating a dielectric material on a conductive strip. The layered structure may be the layered structure 132 (shown in FIG. 3). The layered structure may be formed by depositing dielectric material on a conductive strip. The dielectric material may be an epoxy that is coated onto a conductive strip or conductive foil, such as a copper foil. Optionally, the layered structure may be progressively formed by pulling the conductive strip through a forming station where the dielectric material is progressively applied to the conductive strip. Optionally, the layered structure may be at least partially cured, such as by curing the dielectric material to an intermediate or B stage. Optionally, the dielectric material may be coated by using a doctor blade coater, a draw down coater, a slot die coater, or another coating machine. Alternatively, the dielectric material may be deposited on the conductive strip by other processes in alternative embodiments.

The method includes applying 202 a carrier strip to the layered structure and progressing the carrier strip and the layered structure through the forming system. In an exemplary embodiment, the carrier strip is used to progress the layered structure through the forming system. For example, a transfer device may be used to progress the carrier strip, which in turn progresses the layered structure which is supported by the carrier strip. The carrier strip may be similar to the carrier strip 158 (shown in FIG. 4). The carrier strip may be a polyester film. Other types of carrier strips may be used in alternative embodiments. In an exemplary embodiment, the carrier strip is applied to the dielectric layer of the layered structure. The carrier strip may be applied by pressing the carrier strip and/or layered structure into one another. Rollers may be used to press the carrier strip and layered structure into one another. The carrier strip may be applied by other means or processes in alternative embodiments, such as by embedding the carrier strip in the dielectric layer. In an exemplary embodiment, the carrier strip is removably applied to the layered structure such that the carrier strip may be later removed without damaging the layered structure. In other alternative embodiments, the carrier strip is integrated into the layered structure, such as by incorporating a reinforcing mesh in the dielectric layer, such that the carrier strip is not later removed from the layered structure.

The method includes forming 204 a circuit. The circuit may be formed by etching the conductive strip or conductive layer. Optionally, an etch resist layer may be applied to the conductive layer, exposing portions of the conductive layer. The exposed portions of the conductive layer are etched away, such as in an aqueous etching bath. The etch resist layer may be stripped or removed after the conductive layer is etched away. In an exemplary embodiment, portions of the conductive layer may be plated, such as with a tin plating, to form the circuits. In an exemplary embodiment, the product is progressively formed by progressively moving the product through different stations or processes.

The method includes removing 206 the carrier strip from the layered structure. The carrier strip may be removed by winding the carrier strip up on a reel. The carrier strip is pulled off the layered structure without damaging the layered structure. The layered structure continues on for further processing after the carrier strip is removed. In alternative embodiments, the method does not include the removing step, but rather the carrier strip is integrated into the final product and the carrier strip is progressed downstream to form the final product.

The method includes applying 208 the layered structure to an electronic module substrate. The substrate may be similar to the electronic module substrate 130 (shown in FIG. 3). The layered structure may be applied to the electronic module substrate by pressing the layered structure into the substrate. A roll laminating process may be used to apply the layered structure to the substrate. The dielectric layer of the layered structure may be applied directly to the substrate. Optionally, the dielectric layer may be cured once applied to the substrate to permanently attach the layered structure thereto. In an exemplary embodiment, the product, including the substrate and layered structure, moves through the system to progressively apply the layered structure to the substrate.

The method includes singulating 210 the electronic modules. For example, the electronic modules may be cut or punched from the product strip as the product strip is pulled through the system. The product strip may be sized relative to the electronic module such that there is little waste after the electronic modules are singulated. For example, the product strip may be approximately as wide as the electronic modules such that when the electronic modules are singulated, substantially all of the material of the product strip is used as part of the electronic module.

Figure 6:
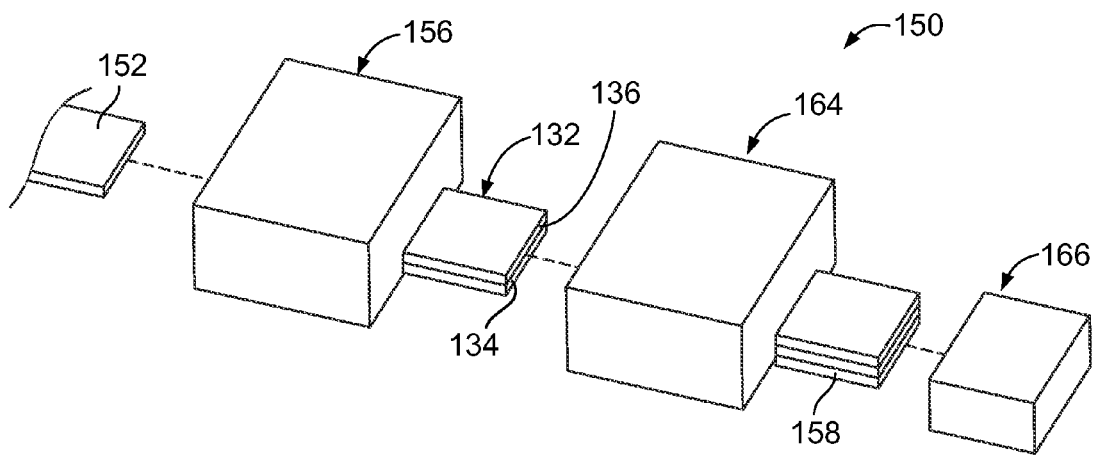
FIG. 6 illustrates a portion of an electronic module formation system in accordance with an exemplary embodiment.

FIG. 6 illustrates a portion of the electronic module formation system 150 in accordance with an exemplary embodiment. The system 150 uses the conductive strip 152 to form the electronic module. The conductive strip 152 is presented to a coating station 156. At the coating station 156, the layered structure 132 is formed. The layered structure 132 is formed by applying dielectric material to the conductive strip 152 to define both the dielectric layer 134 and the conductive layer 136. The layered structure 132 is progressively passed from the coating station 156 to the carrier strip application station 164. At the carrier strip application station 164, the layered structure 132 is applied to the carrier strip 158. The carrier strip 158 is used to pull the layered structure 132 through one or more processing stations 166. In an exemplary embodiment, the dielectric layer 134 is non-permanently secured to the carrier strip 158 such that the carrier strip 158 may later be removed from the layered structure 132. At the processing station 166, the conductive layer 136 is processed to form one or more circuits 116 (shown in FIG. 2).

Figure 7:
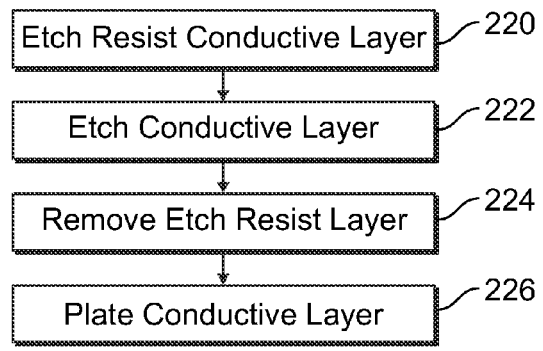
FIG. 7 illustrates a method of processing a conductive layer of an electronic module to form at least one circuit.

FIG. 7 illustrates a method of processing the conductive layer 136 to form at least one circuit 116. The method includes applying 220 an etch resist layer to the conductive layer. The etch resist layer may be a UV curable ink or other type of ink that is printed onto the conductive layer. The etch resist layer may be applied to the conductive layer by other means in alternative embodiments. The etch resist layer exposes portions of the conductive layer.

The method includes etching 222 the conductive layer. Only the exposed portions of the conductive layer are removed during the etching process. The etch resist layer protects other parts of the conductive layer. The etching may be sprayed with etchant or otherwise exposed to etchant. The etching may occur by immersing or submerging the product into an aqueous etching bath where the exposed portions of the conductive layer are exposed to an etching solution that removes the material from the product.

The method includes removing 224 the etch resist layer. The etch resist layer may be removed by submersing the product into a stripping bath that strips the etch resist material from the product. Other processes may be used to strip the etch resist material from the product.

The method includes plating 226 the remaining portion of the conductive layer. Optionally, the conductive layer may be tin plated. The remaining portion of the conductive layer defines one or more circuits defining one or more electronic modules. Other processing steps may be performed in alternative embodiments to form one or more circuits for the electronic modules.

Figure 8:
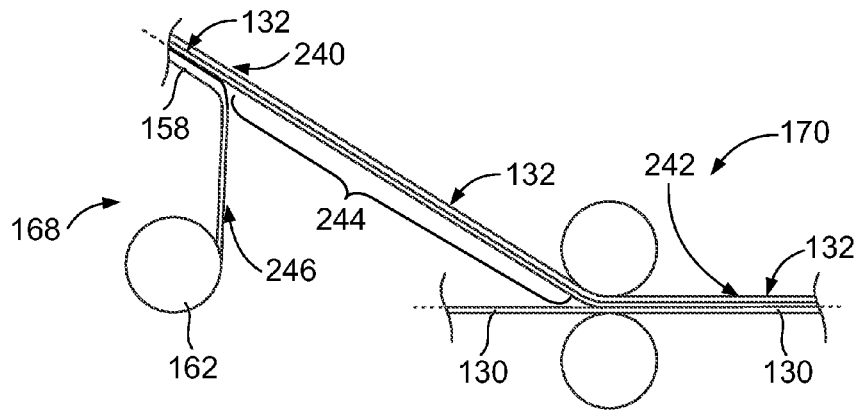
FIG. 8 illustrates a portion of an electronic module formation system.

FIG. 8 illustrates a portion of the electronic module formation system 150 showing the carrier strip removal station 168 and the substrate application station 170. The carrier strip removal station 168 includes the second carrier strip reel 162. The carrier strip 158 pulls the layered structure 132 through the system 150 to the carrier strip removal station 168. The carrier strip 158 is removed from the layered structure 132 by winding the carrier strip 158 onto the carrier strip reel 162. During removal, the carrier strip 158 is pulled away from the dielectric layer 134 without damaging the dielectric layer 134.

The layered structure 132 continues from the carrier strip removal station 168 to the substrate application station 170. The substrate 130 is applied to the layered structure 132 at the substrate application station 170. The substrate 130 pulls the layered structure 132 from the substrate application station 170 and through the downstream stations.

In an exemplary embodiment, the substrate application station 170 includes a pair of rollers. The substrate 130 and layered structure 132 are passed between the rollers, which press the layered structure 132 against the substrate 130 to secure the dielectric layer 134 to the substrate 130. In an exemplary embodiment, the dielectric layer 134 is secondarily cured after the dielectric layer 134 is applied to the substrate 130. The curing process permanently secures the dielectric layer 134 to the substrate 130.

The layered structure 132 includes a first portion 240, a second portion 242 and a third portion 244 between the first and second portions 240, 242. The first portion 240 is supported by the unwound segment 246 of the reel-to-reel carrier strip 158. The conductive layer 136 of the first portion 240 is processed to form at least one circuit 116. The first portion 240 is generally defined between the carrier strip application station 164 (shown in FIG. 4) and the carrier strip removal station 168.

The second portion 242 is supported by the electronic module substrate 130. The second portion 242 is generally the portion of the layered structure 132 downstream of the substrate application station 170 and is the portion of the layered structure 132 that passes through the curing station 172 and singulation station 174 (both shown in FIG. 4). Sections of the second portion 242 are singulated at the singulation station 174 to form individual electronic modules. For example, sections of the second portion 242 and corresponding substrate 130 below the second portion 242 are punched by a machine to singulate the electronic module 100 from the surrounding product strip that is progressively pulled through the system 150.

The third portion 244 is unsupported by either the carrier strip 158 or the electronic module substrate 130. The third portion 244 generally extends between the carrier strip removal station 168 and the substrate application station 170. The third portion 244 is pulled through the system 150 by the second portion 242. Each of the portions 240, 242, 244 are progressively pulled through the system 150 to progressively form circuits and electronic modules. The layered structure 132 is progressively transitioned from the first portion 240 to the third portion 244 and from the third portion 244 to the second portion 242.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means—plus-function format and are not intended to be interpreted based on 35 U.S.C. § 112, sixth paragraph, unless and until such claim limitations expressly use the phrase "means for" followed by a statement of function void of further structure.

What is claimed is:

1. A method of manufacturing an electronic module comprising:
    providing a conductive strip and a dielectric material;
    coating the dielectric material and the conductive strip to form a layered structure having a conductive layer defined by the conductive strip and a dielectric layer defined by the dielectric material;
    temporarily applying a removable carrier strip to the layered structure by stacking the layered structure on the carrier strip;
    progressing the layered structure through a processing station using the carrier strip;
    processing the conductive layer at the processing station to form a plurality of circuits including a first circuit;
    removing the removable carrier strip from the layered structure processed at the processing station by separating the carrier strip from the processed layered structure including the first circuit; and
    applying the processed layered structure with the first circuit to an electronic module substrate after the processed layered structure is removed from the carrier strip such that the carrier strip is not positioned between the processed layered structure and the electronic module substrate.

2. The method of claim 1, wherein said applying the processed layered structure with the circuit to an electronic module substrate comprises applying the processed layered structure to a rigid metal electronic module substrate with the dielectric layer between the conductive layer and the metal electronic module substrate.

3. The method of claim 1, where said applying a carrier strip comprises applying the carrier strip to the layered structure as a layer either above or below the layered structure by unwinding the carrier strip from a reel and applying the unwound carrier strip to the dielectric layer, such that the dielectric layer is between the carrier strip and the conductive layer.

4. The method of claim 1, wherein said removing the carrier strip by separating the carrier strip from the layered structure comprises winding the carrier strip intact on a reel.

5. The method of claim 1, wherein said applying the layered structure comprises progressively pulling the layered structure and electronic module substrate through a substrate application station and pressing the dielectric layer of the layered structure to a surface of electronic module substrate.

6. The method of claim 1, wherein said applying the layered structure comprises positioning the dielectric layer between the conductive layer and the electronic module substrate and curing the dielectric layer to permanently secure the dielectric layer to the conductive layer and the electronic module substrate.

7. The method of claim 1, further comprising singulating an electronic module including the circuit from the surrounding layered structure and electronic module substrate material.

8. The method of claim 1, wherein said coating comprising coating a surface of the conductive strip with the dielectric material and partially curing the dielectric material to secure the dielectric material to the carrier strip.

9. The method of claim 1, wherein said processing comprises etching the conductive layer to remove at least a portion of the conductive layer to define the circuit.

10. The method of claim 1, further comprising progressively removing the carrier strip from the layered structure after the circuit is formed, the layered structure being progressively applied to the electronic module substrate.

11. The method of claim 1, further comprising progressively removing the carrier strip from the layered structure after the circuit is formed, wherein the dielectric material is partially cured prior to applying the carrier strip thereto and the dielectric material is secondarily cured after the electronic module substrate is applied thereto.

* * * * *